United States Patent
Rees et al.

(10) Patent No.: US 7,386,023 B2
(45) Date of Patent: Jun. 10, 2008

(54) SYSTEMS AND METHODS FOR REDUCING HARMONICS PRODUCED BY OSCILLATORS

(75) Inventors: Theodore D. Rees, Mountain View, CA (US); Peter T. Liu, San Jose, CA (US); Joseph R. Pierret, San Jose, CA (US)

(73) Assignee: Intersil Americas Inc., Milpitas, CA (US)

( * ) Notice: Subject to any disclaimer, the term of this patent is extended or adjusted under 35 U.S.C. 154(b) by 308 days.

(21) Appl. No.: 11/121,651

(22) Filed: May 4, 2005

(65) Prior Publication Data
US 2006/0104323 A1 May 18, 2006

Related U.S. Application Data

(60) Provisional application No. 60/628,843, filed on Nov. 17, 2004.

(51) Int. Cl.
*H01S 3/00* (2006.01)
(52) U.S. Cl. .................. 372/38.02; 372/38.08
(58) Field of Classification Search ............ 372/38.02, 372/38.07, 38.08
See application file for complete search history.

(56) References Cited

U.S. PATENT DOCUMENTS

| | | | | |
|---|---|---|---|---|
| 3,510,782 A | * | 5/1970 | Ralph et al. | 327/107 |
| 3,523,236 A | * | 8/1970 | Howell et al. | 363/42 |
| 3,623,160 A | * | 11/1971 | Giles et al. | 341/147 |
| 5,495,464 A | * | 2/1996 | Fujikawa et al. | 369/121 |
| 6,501,317 B2 | | 12/2002 | Lin et al. | |
| 6,603,340 B2 | * | 8/2003 | Tachimori | 327/262 |
| 6,720,836 B2 | | 4/2004 | Lin | |
| 6,803,826 B2 | | 10/2004 | Gomm et al. | |
| 7,230,410 B1 | * | 6/2007 | Jordan | 323/313 |

* cited by examiner

*Primary Examiner*—Armando Rodriguez
(74) *Attorney, Agent, or Firm*—Fliesler Meyer LLP

(57) ABSTRACT

Systems and methods for reducing the harmonic content of an oscillator are provided. More specifically, waveforms with reduced harmonics are provided, as are waveform generators for producing such waveforms. Such waveform generators can be used in or with a laser driver. However, the present invention is not meant to be limited to use with laser drivers. Rather, embodiments of the present invention are useful anywhere where harmonics resulting from an oscillating waveform need to be reduced.

31 Claims, 15 Drawing Sheets

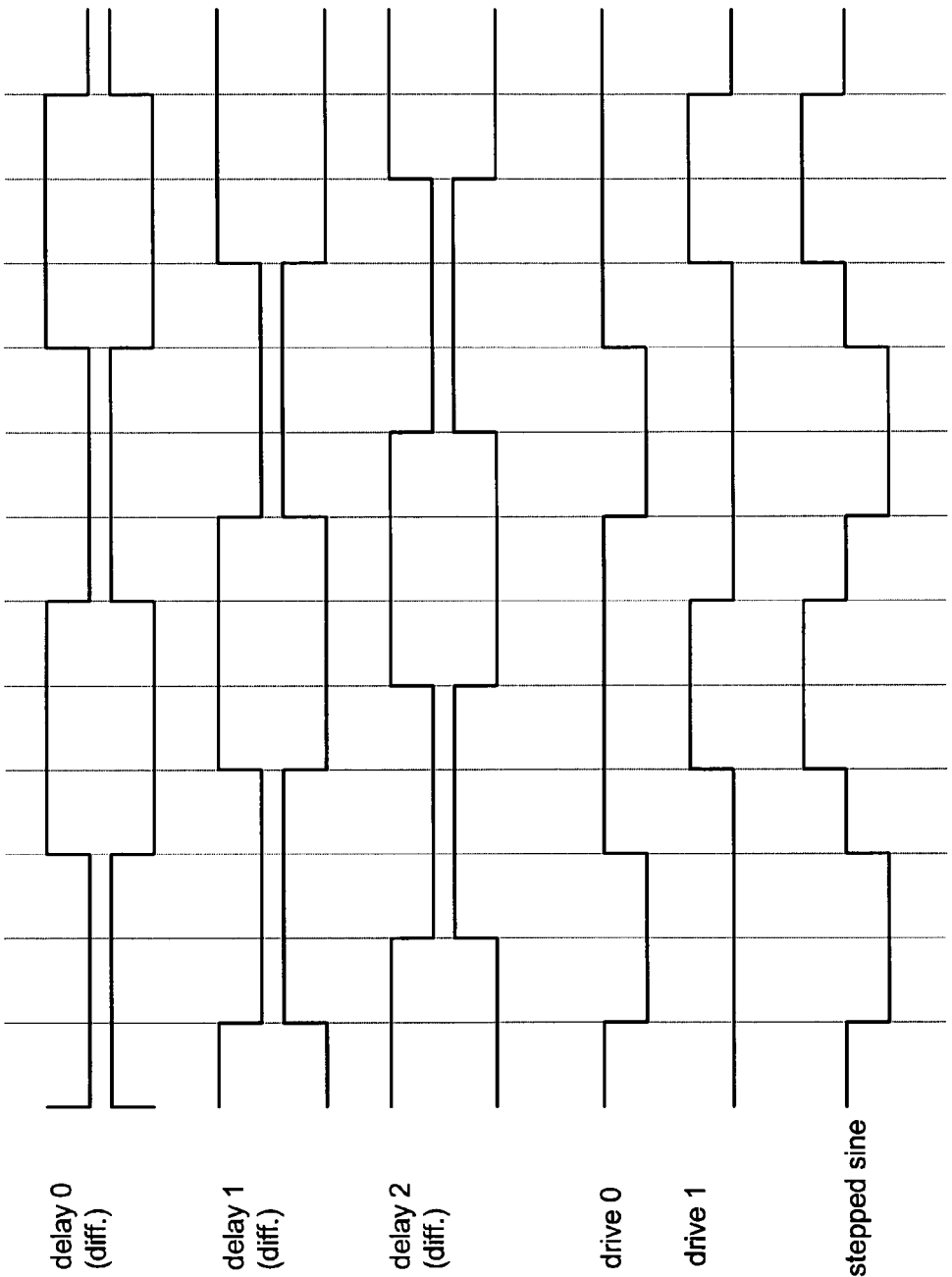

SYSTEMS AND METHODS FOR REDUCING HARMONICS PRODUCED BY OSCILLATORS

PRIORITY CLAIM

This application claims priority under 35 U.S.C. 119(e) to U.S. Provisional Patent Application No. 60/628,843, filed Nov. 17, 2004, which is incorporated herein by reference.

FIELD OF THE INVENTION

Embodiments of the present invention relate to the field of integrated circuits, and more specifically to oscillators (also referred to as waveform generators), and the waveforms produced by oscillators.

BACKGROUND

Optical drives often employ radio frequency (RF) oscillators to reduce laser noise. FIG. 1, shows the block diagram of a laser driver 102 that is used to drive a laser diode 120.

The laser driver 102 includes a write driver 104, a read driver 106, and an oscillator 108. The write driver 104 is capable of providing different write current signals to the laser diode 120, which are useful for writing data to a storage medium (e.g., a DVD or CD). The read driver 106 is capable of providing different read current signals to the laser diode 120, which are useful for reading data from the storage medium. It is common for the laser diode 120 to mode-hop due to external light reflected back into the laser cavity and generate additional system noise. To avoid or reduce the mode-hopping, an RF current can be applied to the laser diode 120 using oscillator 108. The oscillator 108 is most often used in this manner when in read mode, resulting in the current signal generated by the oscillator 108 being added to the current signal generated by the read driver 106, with the resulting current signal driving the laser diode 120.

The oscillator 108 pumps significant current into the laser diode 120. Harmonics generated by the oscillator propagate down traces of the board on which the laser driver is mounted and often cause problems with electromagnetic interference (EMI) emissions.

One solution for reducing harmonics is to produce an oscillator that generates a substantially pure sine wave. However, generating a pure sine wave is difficult because of inherent non-linearities of circuit elements. Any distortion arising from these non-linearities result in harmonics at the output.

Another solution for reducing harmonics is to filter the output of the oscillator with a passive network that includes resistors, capacitors and inductors. However, such a passive filter is difficult to implement at RF frequencies due to the sharp cutoff required between the fundamental and the harmonics. Furthermore, the inductors required occupy a large amount of chip real estate, and the resistors of a passive filter would dissipate power, neither of which effect is desirable.

Accordingly, it would be beneficial to provide oscillators and waveforms that overcome some, and preferably all, of the above disadvantages.

SUMMARY OF THE PRESENT INVENTION

Embodiments of the present invention relate to waveform generators (e.g., oscillators), waveforms produced by such generators, and laser drivers that include such waveform generators. Embodiments of the present invention also relate to methods for producing such waveforms.

In accordance with an embodiment of the present invention, a laser driver, for use in driving a laser diode, includes a read driver, a waveform generator and an output stage. The read driver produces a read current signal. The waveform generator produces a substantially symmetrical x-level, y-interval current signal that has substantially no even harmonics and reduced odd harmonics, where x is an odd integer $\geq 3$, and y is an even integer $\geq 6$. The output stage adds the signal produced by the read driver to the signal produced by the waveform generator to produce a drive signal.

In accordance with an embodiment, the waveform generator produces a substantially symmetrical 3-level, 6-interval current signal that has substantially no even harmonics and substantially no 3rd harmonic. For each up-step of the substantially symmetrical 3-level, 6-interval current signal, there is a down-step of substantially equal magnitude to the up-step that is separated by substantially 120 degrees from the up-step, according to an embodiment of the present invention.

In accordance with an embodiment, 360 degrees of the substantially symmetrical 3-level, 6-interval current signal includes: a first portion is at a low current level for a first interval; a second portion is at a mid current level for a second interval, the second portion following the first portion; a third portion is at a high current level for a third interval and a fourth interval, the third portion following the second portion; a fourth portion is at the mid current level for a fifth interval, the fourth portion following the third portion; and a fifth portion is at the low current level for a sixth interval, the fifth portion following the fourth portion; wherein each of the first through sixth intervals is substantially 60 degrees. In accordance with an embodiment, a difference between the low current level and the mid current level is substantially equal to a difference between the mid current level and the high current level.

In accordance with an embodiment, to eliminate even harmonics and an $n^{th}$ odd harmonic, the waveform generator produces a substantially symmetrical x-level, y-interval waveform within which all up-steps are followed by an equal down step m*360/n degrees apart, where m is any integer and n is an odd integer (e.g., 1, 3, etc.).

In accordance with another embodiment, the waveform generator produces a substantially symmetrical 5-level, 8-interval current signal that has substantially no even harmonics and reduced 3rd and 5th harmonics. Although this waveform does not produce perfect cancellation of the 3rd and 5th harmonics, these harmonics are reduced in amplitude.

In a specific embodiment, 360 degrees of the substantially symmetrical 5-level, 8-interval current signal includes: a first portion that is at a first current level for a first interval; a second portion that is at a second current level for a second interval, the second portion following the first portion, and the second current level being greater than the first current level; a third portion that is at a third current level for a third interval, the third portion following the second portion, and the third current level being greater than the second current level; a fourth portion that is at a fourth current level for a fourth interval, the fourth portion following the third portion, and the fourth current level being greater than the third current level; a fifth portion that is at a fifth current level for a fifth interval, the fifth portion following the fourth portion, and the fifth current level being greater than the fourth current level; a sixth portion that is at the fourth current level for a sixth interval, the sixth portion following the fifth portion; a seventh portion that is at the third current level for a seventh interval, the seventh portion following the sixth portion; and an eighth portion that is at the second current level for an eighth interval, the eighth portion following the seventh portion; wherein each of the first through eighth intervals is substantially 45 degrees. In accordance with an embodiment, a difference between the first and second current levels is substantially equal to a difference between the fourth and fifth current levels; a difference between the second and third current levels is substantially equal to a difference between the third and fourth current levels; and the difference between the second and third current levels is about three times the difference between the first and second current levels.

In accordance with an embodiment, a waveform generator includes a ring-oscillator including a plurality of differential delay elements, logic circuitry and adding circuitry. The plurality of delay elements each produce differential delay signals. The logic circuitry receives at least some of the delay signals produced by the ring-oscillator and produces drive signals therefrom. The adding circuitry adds the drive signals to thereby produce the substantially symmetrical x-level, y-interval current signal therefrom.

In accordance with another embodiment, the waveform generator includes a square-wave oscillator, one or more delay elements, logic circuitry and adding circuitry. The oscillator produces a square wave signal. The one or more delay element receives the square wave signal (or delayed versions thereof) and produces one or more delayed square wave signal therefrom. Logic circuitry receives the square wave signal and the delayed square wave signal(s) and produces drive signals therefrom. Adding circuitry adds the drive signals and thereby produces the substantially symmetrical x-level, y-interval current signal therefrom.

Further embodiments, and the features, aspects, and advantages of the present invention will become more apparent from the detailed description set forth below, the drawings and the claims.

BRIEF DESCRIPTION OF THE DRAWINGS

FIG. 3B illustrates the various delay and drive waveforms that are produced by the circuit of FIG. 3A, in order to produce the 3-level wave of FIG. 2A.

DETAILED DESCRIPTION

Figure 1:
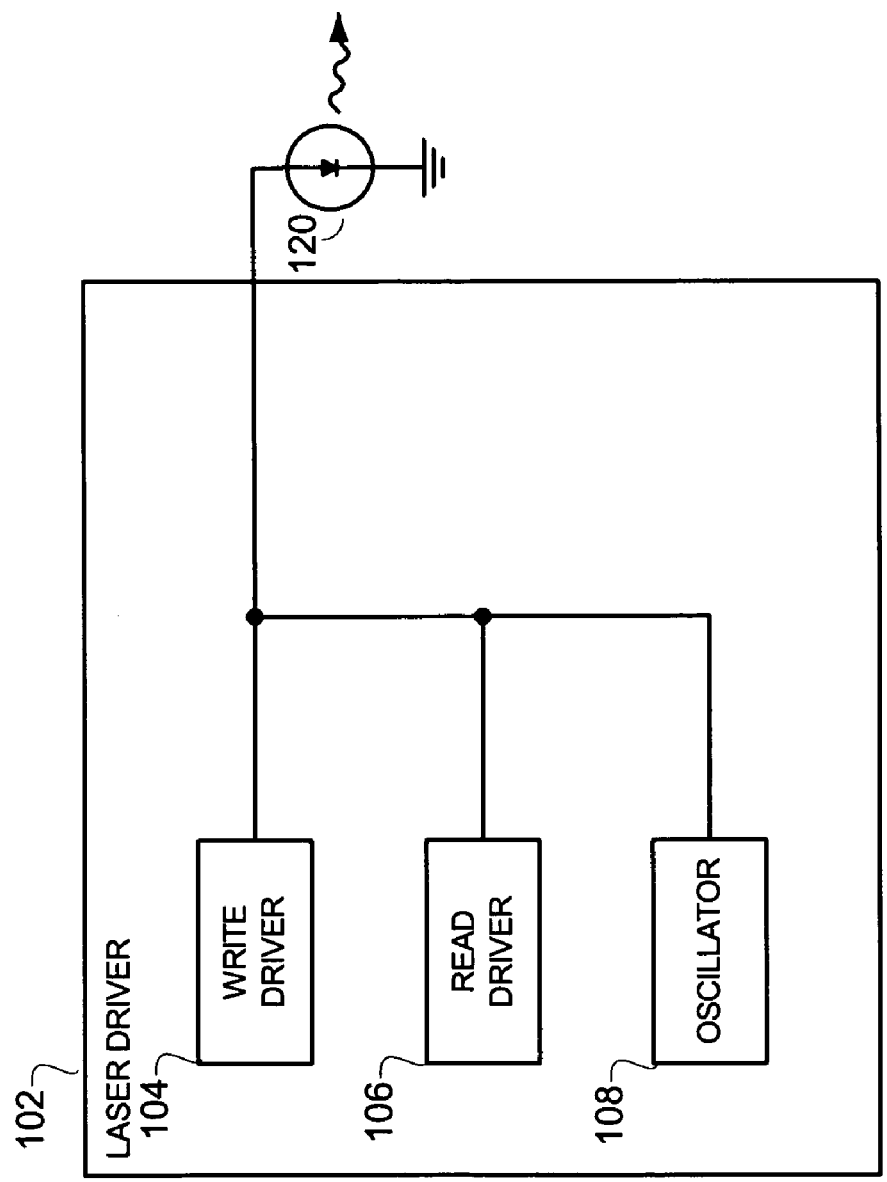
FIG. 1 shows the connection of a laser driver, incorporating a high frequency oscillator, to a laser diode.
Figure 2A:
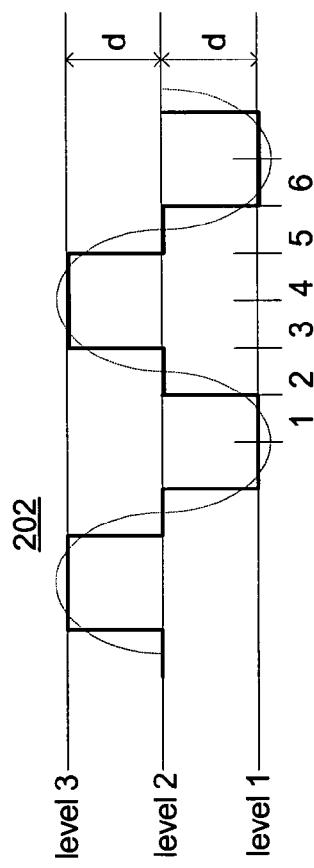
FIG. 2A illustrates a 3-level, 6-interval wave, of an embodiment of the present invention, that results in significant reductions in harmonics.

FIG. 2A illustrates a waveform 202 according to an embodiment of the present invention. Because of its resemblance to a sine wave, waveform 202 will be referred to herein as a stepped-sine wave. Because it includes three levels, and six intervals, waveform 202 will also be referred to as a 3-level, 6-interval, stepped-sine wave. As will be described below, the stepped-sine wave 202 can be generated using circuitry, in accordance with embodiments of the present invention. Such circuitry can be relatively simple because only one step is required halfway between a minimum and maximum amplitude, to eliminate the 3rd harmonic. The timing breaks the wave into 60 degree intervals. The waveform is low for 2 intervals, mid for 1 interval, high for 2 intervals, mid for 1 interval, and back to low. The preferred relative distances between the 3 levels are also shown in FIG. 2A. More specifically, it is preferred that the amplitude distance (d) between level 1 and level 2 is equal to the distance between level 2 and level 3.

This 3-level, 6-interval stepped-sine wave 202 does not result in even harmonics, because it is a symmetrical waveform. Additionally, it has been shown that this waveform 202 produces reduced odd harmonics, and importantly, no 3rd harmonic. To get rid of the 3rd harmonic, the rising edge at 30 degrees is followed by the falling edge of substantially equal amplitude at 150 degrees, where the 120 degrees separation is the key to the 3rd harmonic reduction. This also requires that the falling edge at 210 degrees is followed by the rising edge at 330 degrees, with the 120 degrees of separation. It is believed that as long as each rising edge is followed (or preceded) by a corresponding falling edge of substantially equal magnitude 120 degrees later (or earlier), then the 3rd harmonic will be eliminated. But if the lower 120 degrees is phase shifted, then even harmonics will appear. Just like the even harmonics disappear from the Fourier analysis of a square wave, the 3rd harmonic disappears with the stepped-sine wave 202. Similarly, if the duty cycle is 49% or 51% (i.e., if the wave is not completely symmetric), then some even harmonics will appear. These are mathematical realities, as can be seen from the graph of FIG. 2B, which is a graph of modulation angle verses relative harmonics for a 3-level waveform.

Figure 2B:
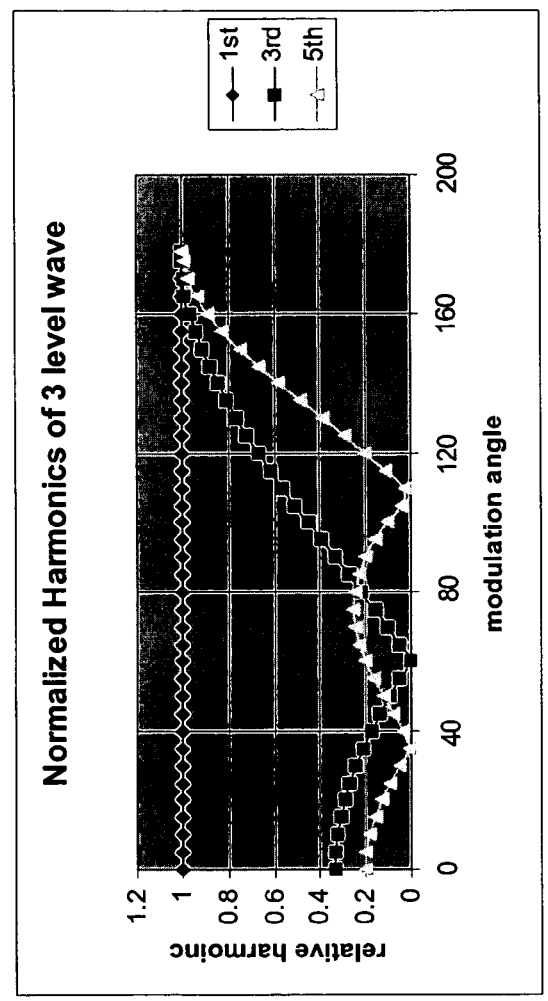
FIG. 2B is a graph of modulation angle versus relative harmonic strength for a 3-level wave.

In FIG. 2B, the modulation angle refers to the angle from zero degrees where the waveform rises from level 2 to level 3. Referring to FIG. 2B, it can be seen that at 60 degrees, the 3rd harmonic is gone, but at slightly higher or lower than 60 degrees, it is not. The criteria for the 5th harmonic to be eliminated is that the falling edge is 72 degrees from the rising edge. This occurs for two different waveforms. In one the modulation angle is 108 degrees, and the falling edge occurs 72 degrees after the rising edge. In the other, the modulation angle is 36 degrees, and the falling edge occurs at 144 degrees after the rising edge. At somewhere around 45 degrees, the 3rd and 5th harmonics are at a combined minimum. In embodiments where the 5th harmonic is not a problem, it may be preferable to set the timing at 60 degrees to eliminate the 3rd harmonic completely. However, where there is a desire to reduce both the 3rd and 5th harmonics, it is useful to set the timing at 45 degrees (as will be appreciated from the discussion of FIG. 7).

Figure 3A:
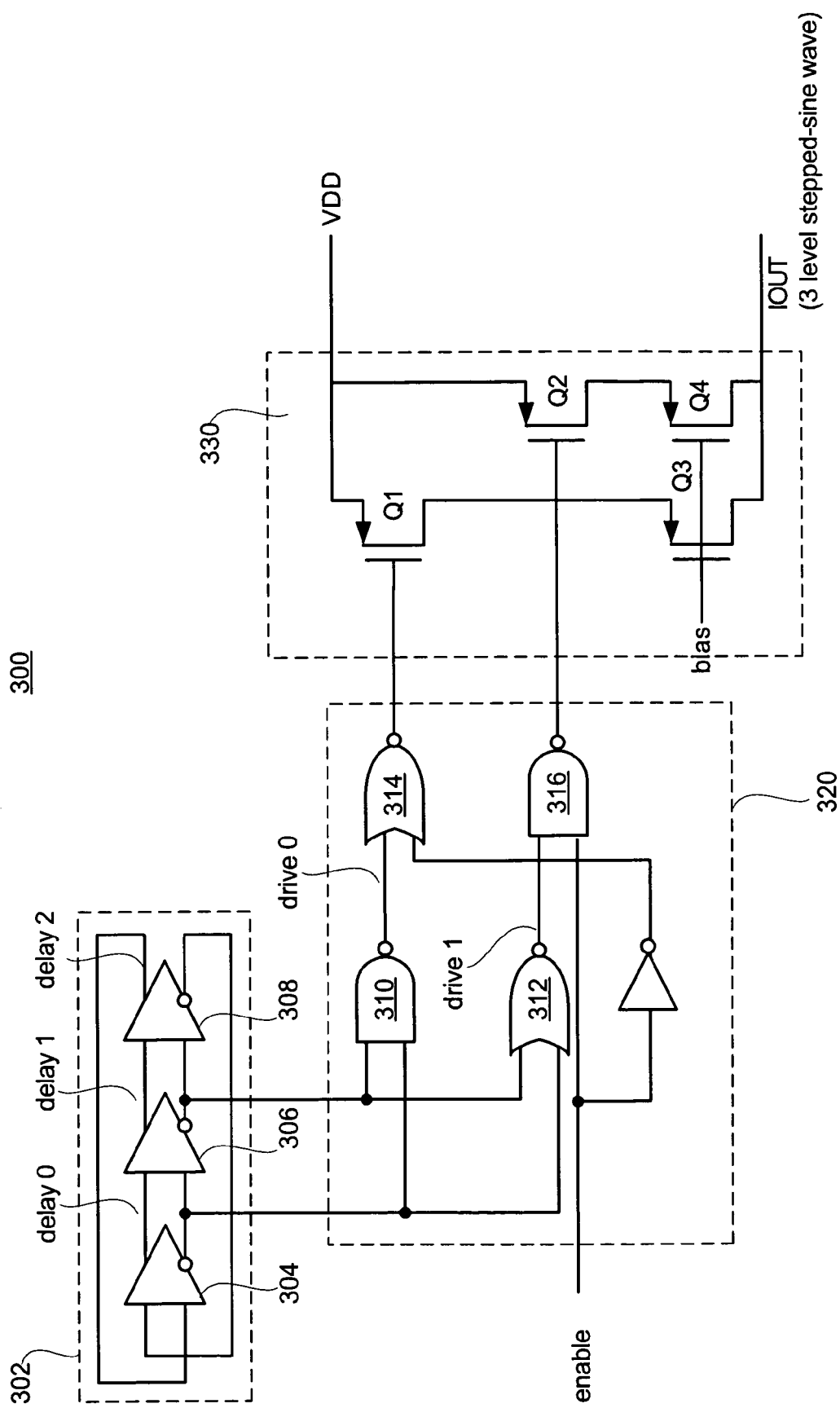
FIG. 3A illustrates a representative schematic of a circuit that can be used to produce the 3-level waveform of FIG. 2A.

Embodiments of the present invention also relate to systems and methods that can be used to produce waveform 202, as will be discussed with reference to FIGS. 3A and 3B. More specifically, FIG. 3A illustrates a representative schematic of a circuit that can be used to produce waveform 202, in accordance with an embodiment of the present invention. FIG. 3B illustrates the various delay and drive waveforms that can be used to produce waveform 202, in accordance with an embodiment of the present invention.

Referring to FIG. 3A, the stepped-sine wave generator 300 includes a differential ring oscillator 302, which includes three differential delay elements 304, 306 and 308. The differential ring oscillator 302 may also be called a delay locked-loop (DLL) oscillator (as opposed to a phase locked loop, if the frequency of the loop is locked to an external clock). The differential outputs of delay elements 304, 306 and 308, which are labeled delay 0, delay 1 and delay 2, respectively, are shown in FIG. 3B. A logic circuit 320 receives the outputs of certain ones of the delay elements, as shown in FIG. 3B, to thereby produce drive signals labeled drive 0 and drive 1. Since drive 0 is shown as being produced at the output of a NAND gate 310, and drive 1 is shown as being produced at the output of a NOR gate 312, it is possible that the drive 0 and the drive 1 signals may be slightly out of phase (i.e., if the delay produced by the NAND gate 310 differs from the delay produced by the NOR gate 312). To compensate for this, the output of the NAND gate 310 is fed through a NOR gate 314 (which should be substantially identical to NOR gate 312), and the output of the NOR gate 312 is fed through a NAND gate 316 (which should be substantially identical to NAND gate 310). When the enable signal is high, the phase adjusted drive 0 and drive 1 signals are provided to an adder circuit 330 (also referred to as an output stage 330), which outputs a current signal (IOUT) having the shape of stepped-sine wave 202. In this case level 1 corresponds to a zero current output.

FIG. 3B shows the differential delay signals, as well as the drive signals. It can be appreciated from FIG. 3B how adding the drive signals 0 and 1 produces the stepped sine wave signal 202, shown at the bottom of FIG. 3B.

Figure 4:
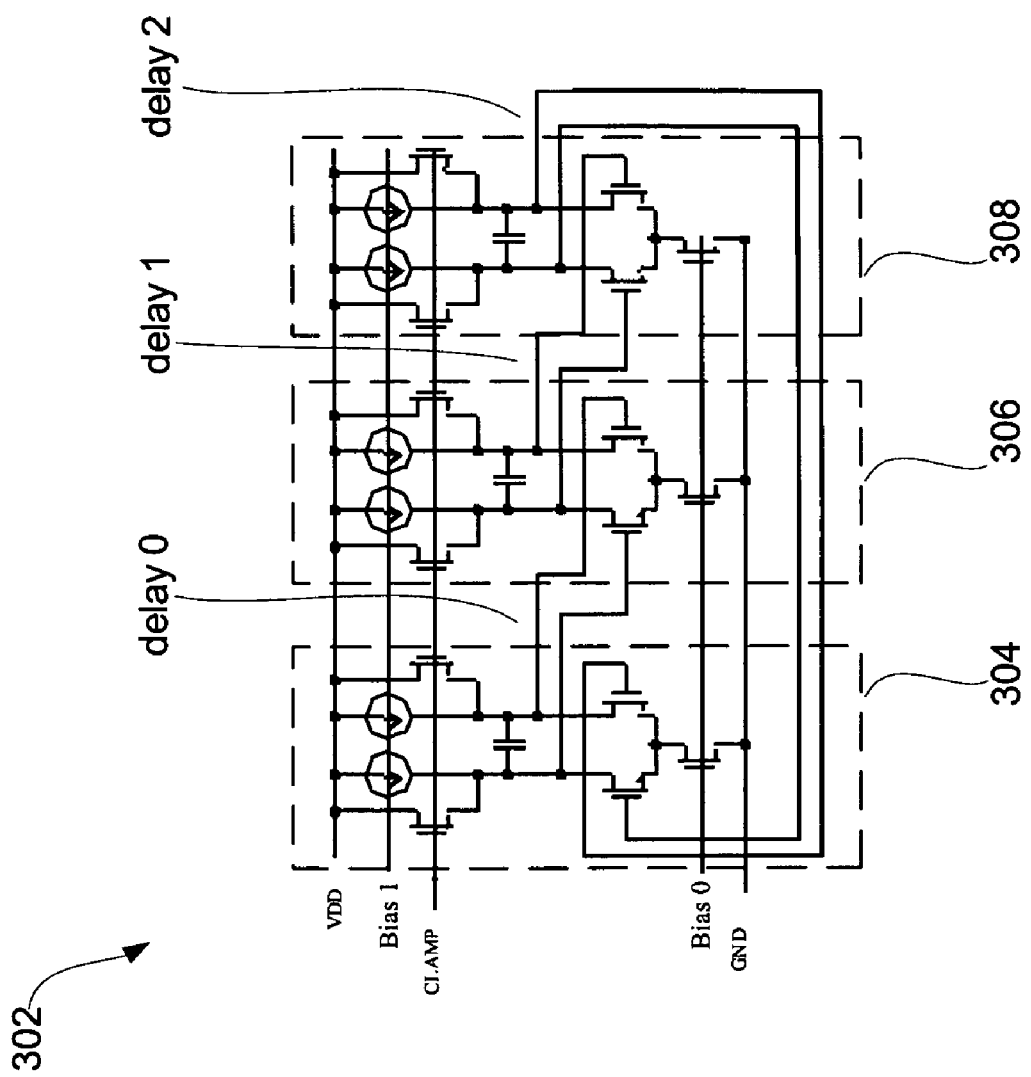
FIG. 4 shows an implementation of the differential ring oscillator 302 shown in FIG. 3A, according to an embodiment of the present invention.

FIG. 4 shows a specific implementation of the differential delay oscillator 302, including specific implementations of differential delay elements 304, 306 and 308, in accordance with an embodiment of the present invention. In FIG. 4, each differential delay element provides a variable delay output. In accordance with a specific embodiment of the present invention, there are two biases. One bias (bias 1 in FIG. 4) is tied to the PMOS current sources, and another bias (bias 0 in FIG. 4 is tied to the 3 gates of the NMOS transistors shown at the bottom of the circuit. One of ordinary skill in the art would appreciate that fixed delay elements can also be used if the frequency is fixed.

Figure 5A:
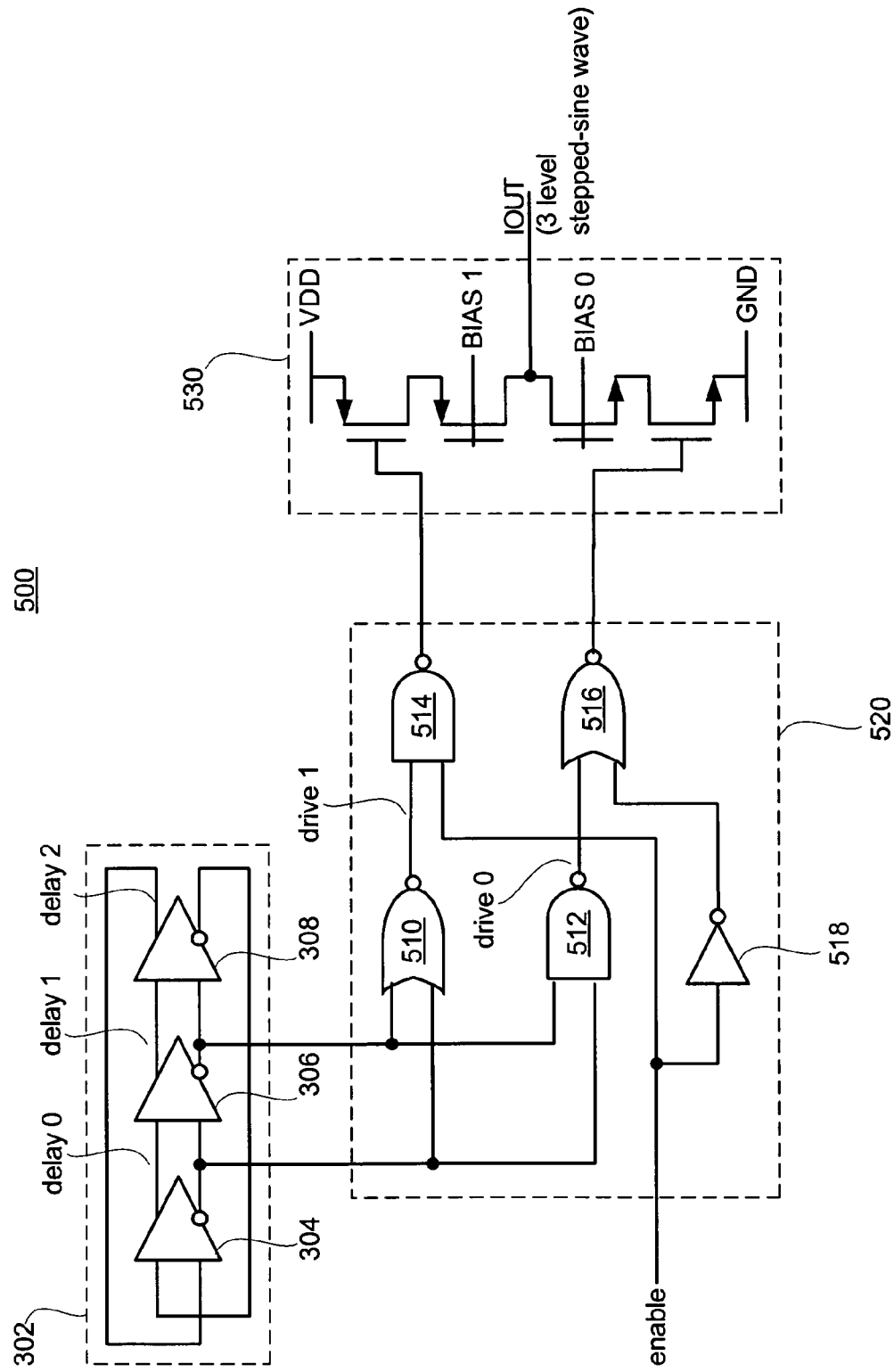
FIG. 5A illustrates a representative schematic of a circuit that can be used to produce a 3-level, 6-interval stepped-sine wave, useful for driving a push-pull type load, in accordance with an embodiment of the present invention.
Figure 5B:
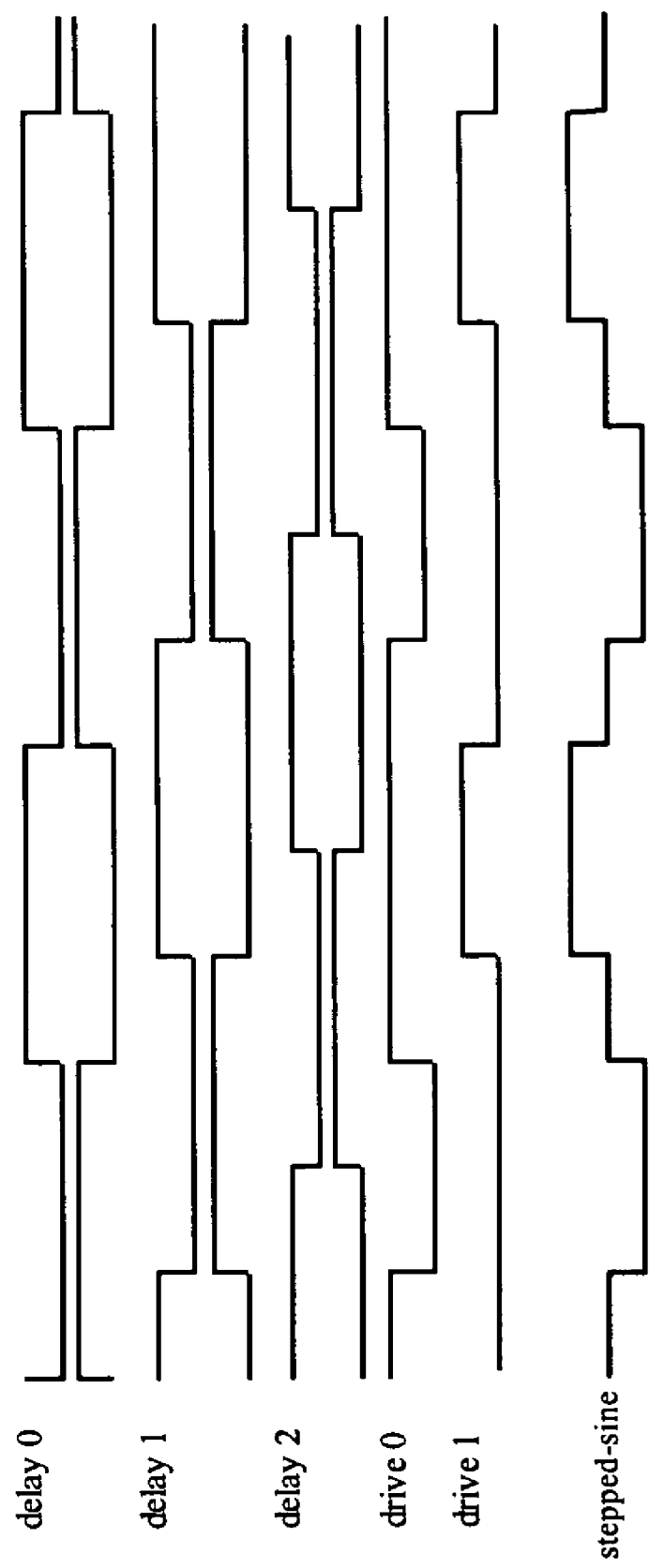
FIG. 5B illustrates the various delay and drive waveforms that are produced by the circuit of FIG. 5A, in accordance with an embodiment of the present invention.

The output stage 330 of the stepped-sine wave generator 300 in FIG. 3A is useful where the load being driven is a push-only type load. FIG. 5A illustrates a representative schematic of a circuit that can be used to produce a stepped-sine wave useful for driving a push-pull type load, in accordance with an embodiment of the present invention. FIG. 5B illustrates the various delay and drive waveforms produced by the circuit of FIG. 5A, in accordance with an embodiment of the present invention. The waveform generator 500 shown in FIG. 5A is similar to the generator 300 shown in FIG. 3A, except that output stage 530 in FIG. 5A forms a push-pull driver, and the logic 520 is slightly different. Thus, in this embodiment, level 2 corresponds to a zero current output, level 1 corresponds to a negative current output (for pulling), and level 3 corresponds to a positive current output (for pushing). In contrast, the output stage 330 in FIG. 3A forms a push-only driver.

Figure 6A:
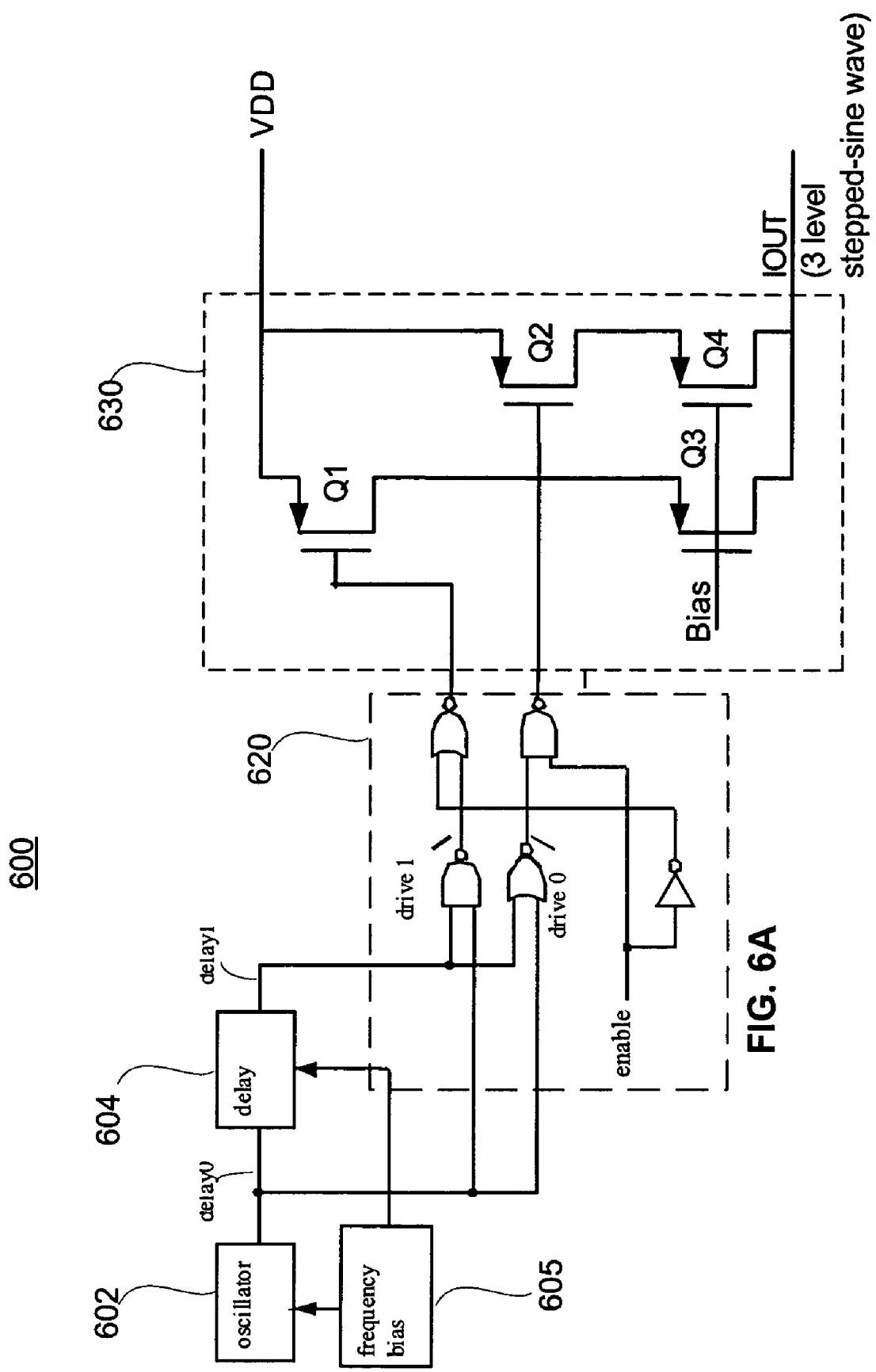
FIG. 6A illustrates an alternative waveform generator that can produce the 3-level wave of FIG. 2A, according to an embodiment of the present invention.
Figure 6B:
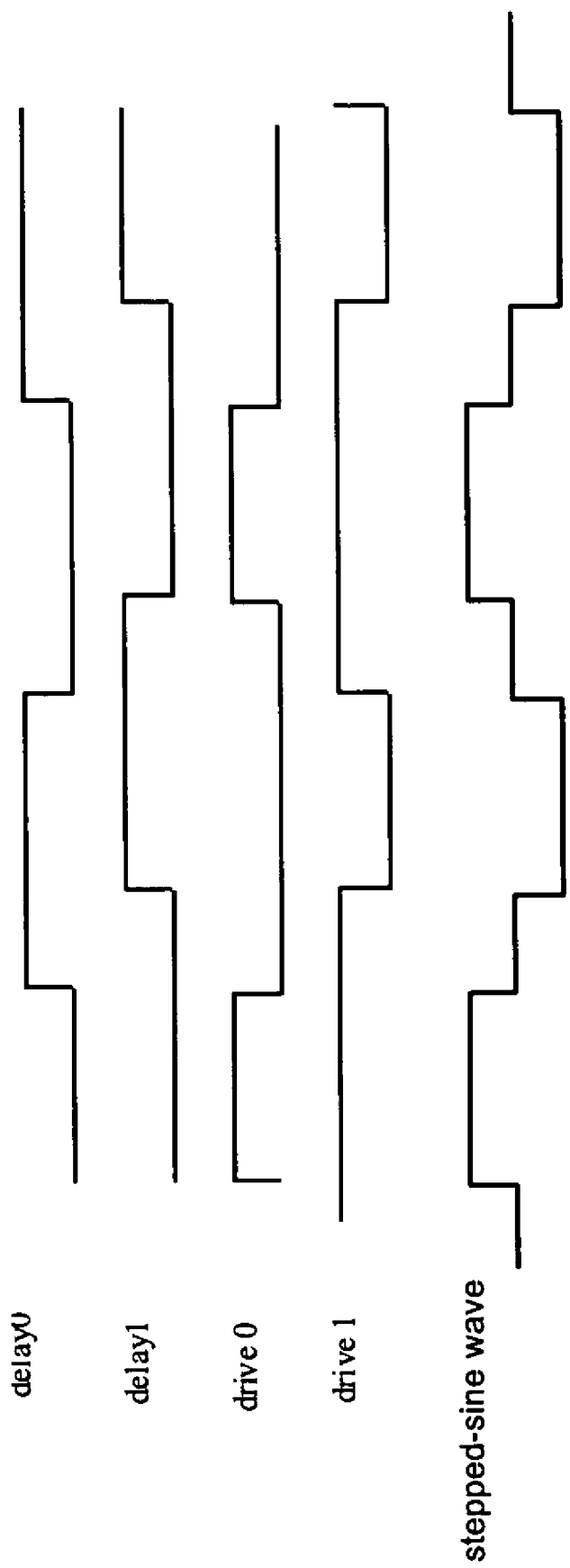
FIG. 6B illustrates the various delay and drive waveforms that are produced by the circuit of FIG. 6A, in accordance with an embodiment of the present invention.

In accordance with an alternative embodiment of the present invention, the stepped-sine wave 202 (shown in FIG. 2A) is produced using the alternative waveform generator 600, shown in FIG. 6A. Waveform generator 600 is shown as including a square wave oscillator 602, a delay element 604 (e.g., a pair of inverters), a frequency bias 605, a logic circuit 620 and an adding circuit 630. The adding circuit 630 can also be referred to as an output stage 630. The delay 0 and delay 1 signals produced at the labeled points in FIG. 6A, are shown in FIG. 6B. FIG. 6B also shows the drive 1 and drive 0 signals produced at the labeled points in FIG. 6A. The logic circuit 620 is balanced in a manner similar to that discussed above with regards to FIG. 3A, in order to keep the drive signals in phase. It can be appreciated from FIG. 6B how adding the drive 0 and drive 1 signals produces the stepped sine wave signal, shown at the bottom of FIG. 6B. Because the stepped sine wave at the bottom of FIG. 6B is produced by essentially digitally filtering the output of square wave oscillator 602, waveform generator 600 can be referred to as a filtered 3-level wave generator, and the stepped-sine wave can also be referred to as a filtered square wave. The stepped-sine wave produced by the circuit of FIG. 6A is useful for driving a push-only load. However, as can be appreciated from the discussion of FIG. 5A, output stage 630 can be easily modified such that the stepped-sine wave is useful for driving a push-pull type load.

Figure 7:
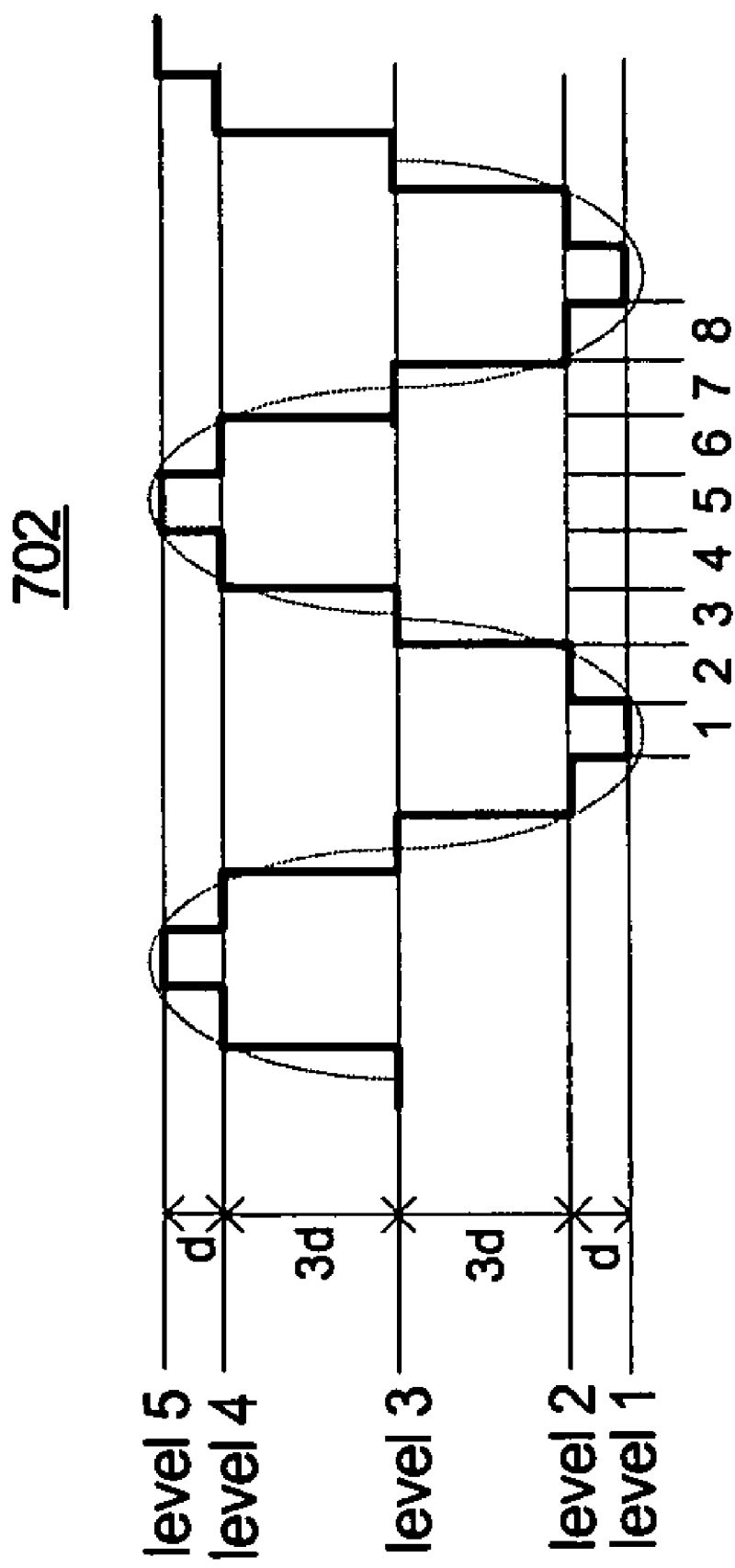
FIG. 7 illustrates a 5-level, 8-interval wave, of an embodiment of the present invention, that results in substantially no even harmonics and significant reductions in 3rd and 5th odd harmonics.

FIG. 7 illustrates a waveform 702 according to another embodiment of the present invention. Because of its resemblance to a sine wave, and its 5-levels and 8-intervals, waveform 702 will be referred to herein as a 5-level, 8-interval stepped-sine wave. As with the 3-level, 6-interval stepped-sine wave 202, the 5-level, 8-interval stepped-sine wave 702 can be generated using circuitry, in accordance with embodiments of the present invention. While such circuitry is somewhat more complicated than the circuit required to generate wave 202, it can still be relatively simple. As will be understood from the timing diagram of FIG. 8B, timing breaks the wave into 45 degree intervals, that start with a 22.5 degree offset. The waveform is at the first (lowest) level for 1 interval, at the second level for 1 interval, at the third level for 1 interval, at the fourth level for 1 interval, at the fifth (highest) level for 1 interval, down to the fourth level for 1 interval, down to the third level for 1 interval, down to the second level for 1 interval, and then returns to the first level (at which point the waveform repeats). The preferred relative distances between the 6 levels is also shown in FIG. 7. More specifically, the distance (d) between level 1 and level 2 should be equal to the distance between level 4 and level 5; and the distance between level 2 and level 3 should be equal to the distance between levels 3 and 4. To minimize the harmonics relative to a sine wave, the ratio of the interval between levels 1 and 2, and levels 2 and 3 should be about 1 to 3. The above described 5-level, 8-interval waveform, because of its symmetry, has substantially no even harmonics. Additionally, it also has reduced 3rd and 5th harmonics.

Figure 8A:
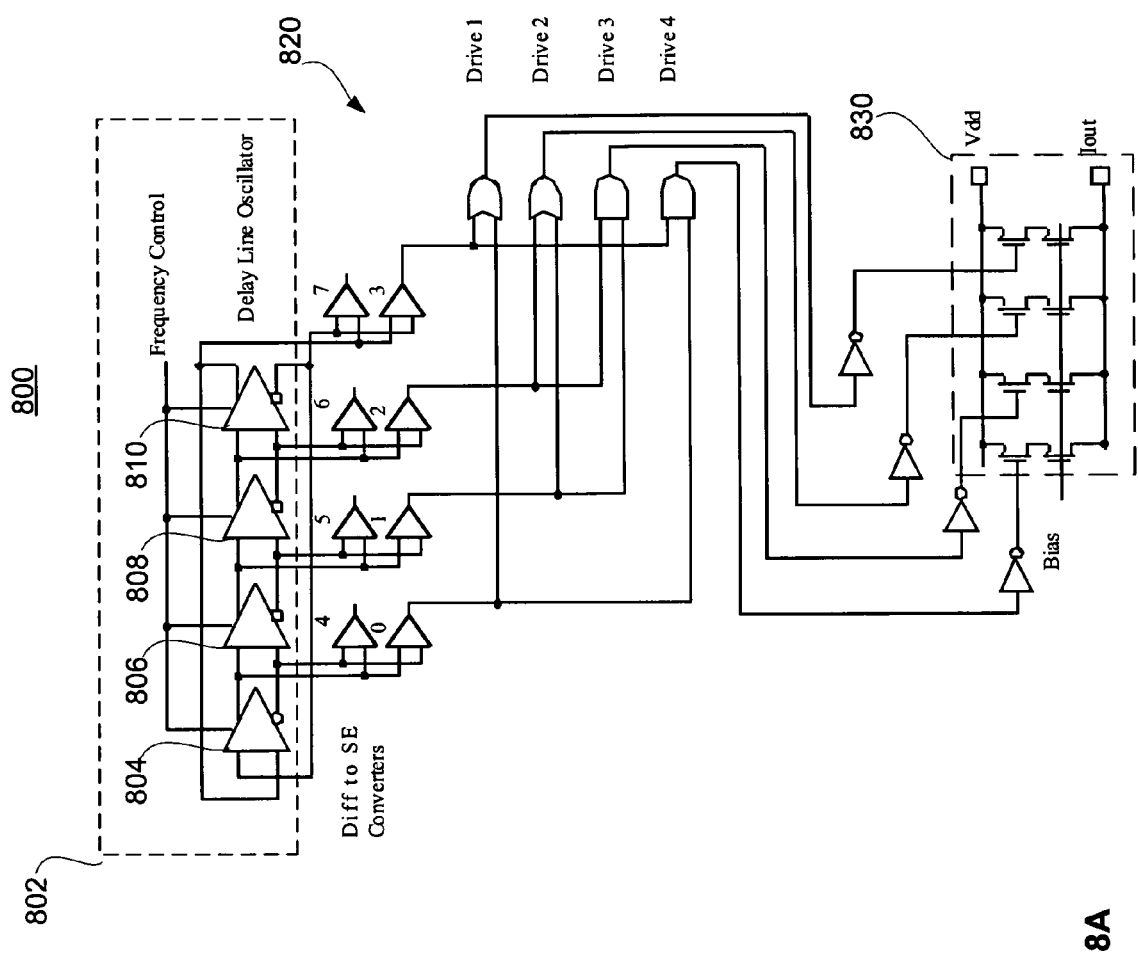
FIG. 8A illustrates a representative schematic of a circuit that can be used to produce the 5-level waveform of FIG. 7.
Figure 8B:
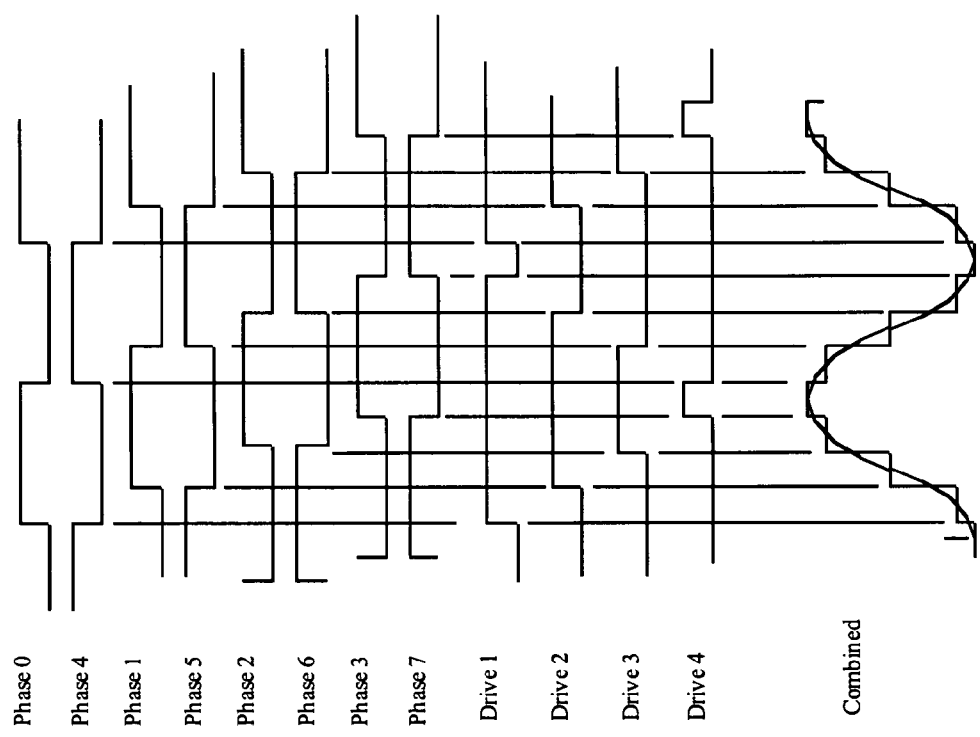
FIG. 8B illustrates the various delay and drive waveforms that are produced by the circuit of FIG. 8A, in order to produce the 5-level waveform of FIG. 7.

FIG. 8A shows a waveform generator 800 that is similar to FIG. 3A, but used to produce the 5-level, 8-interval stepped-sine wave 702, in accordance with an embodiment of the present invention. FIG. 8B is similar to FIG. 3B, except that it shows the delay and drive signals used to produce 5-level, 8-interval stepped-sine wave 702, in accordance with an embodiment of the present invention. As shown in FIG. 8A, the waveform generator 800 includes a differential ring oscillator 802 (including four differential delay elements 804, 806, 808 and 810), logic circuitry 820 and adding circuitry 830. The logic circuit 820 is not shown as being balanced. However, as would be understood from the description of FIG. 3A above, the logic circuit could be balanced by following AND gates with OR gates (or NAND gates with NOR gates), and vice versa, as appropriate, to thereby keep all drive signals in phase. The stepped-sine wave produced by the circuit of FIG. 8A is useful for driving a push-only load. However, as can be appreciated from the discussion of FIG. 5A, output stage 830 can be easily modified such that the stepped-sine wave is useful for driving a push-pull type load.

Figure 9:
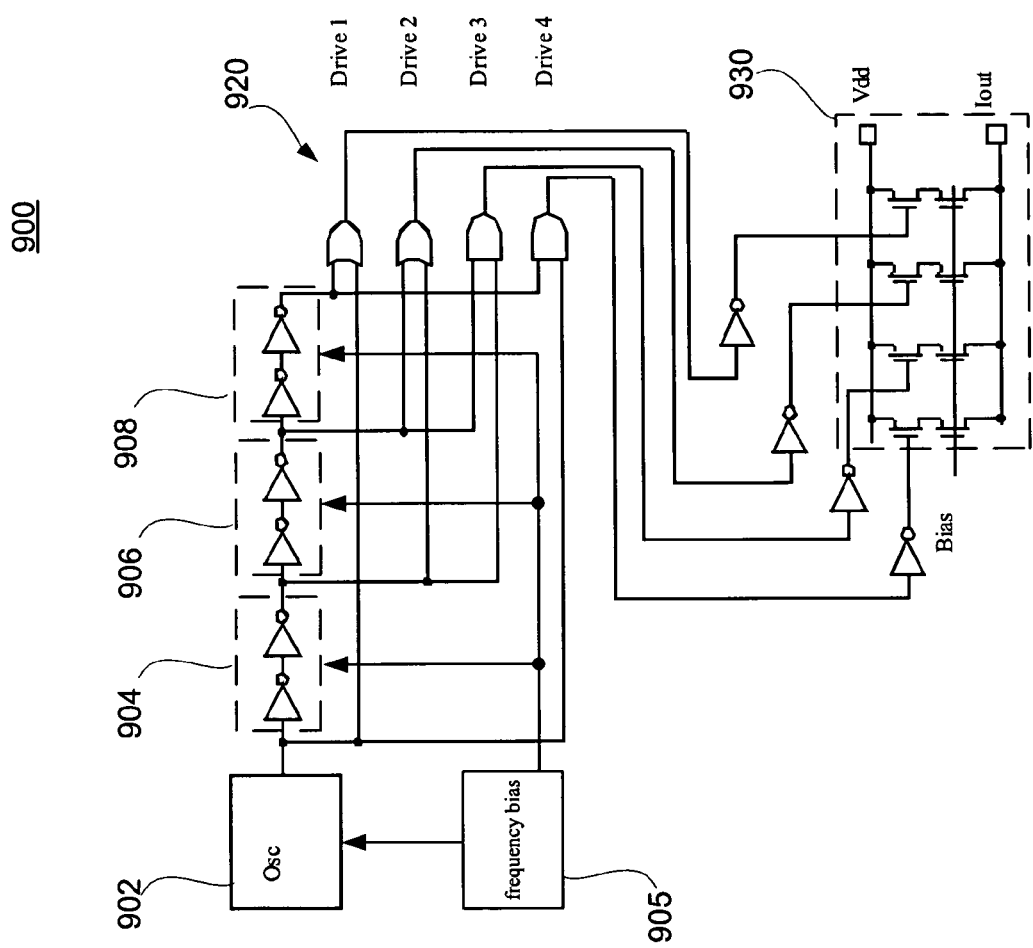
FIG. 9 illustrates an alternative waveform generator that can produce the 5-level wavefom of FIG. 7, according to an embodiment of the present invention.

FIG. 9 shows a waveform generator 900 that is similar to FIG. 6A, but used to produce the 5-level, 8-interval stepped-sine wave 702, in accordance with another embodiment of the present invention. Waveform generator 900 is shown as including an oscillator 902, three delay elements 904, 906 and 908, a frequency bias 905, a logic circuit 920 and an adding circuit 930. The adding circuit 930 can also be referred to as the output stage 930. The logic circuit 920 is not shown as being balanced. However, as would be understood from the description of FIG. 3A above, the logic circuit could be balanced by following AND gates with OR gates (or NAND gates with NOR gates), and vice versa, as appropriate, to thereby keep all drive signals in phase. The stepped-sine wave produced by the circuit of FIG. 9 is useful for driving a push-only load. However, as can be appreciated from the discussion of FIG. 5A, output stage 930 can be easily modified such that the stepped-sine wave is useful for driving a push-pull type load.

Figure 10A:
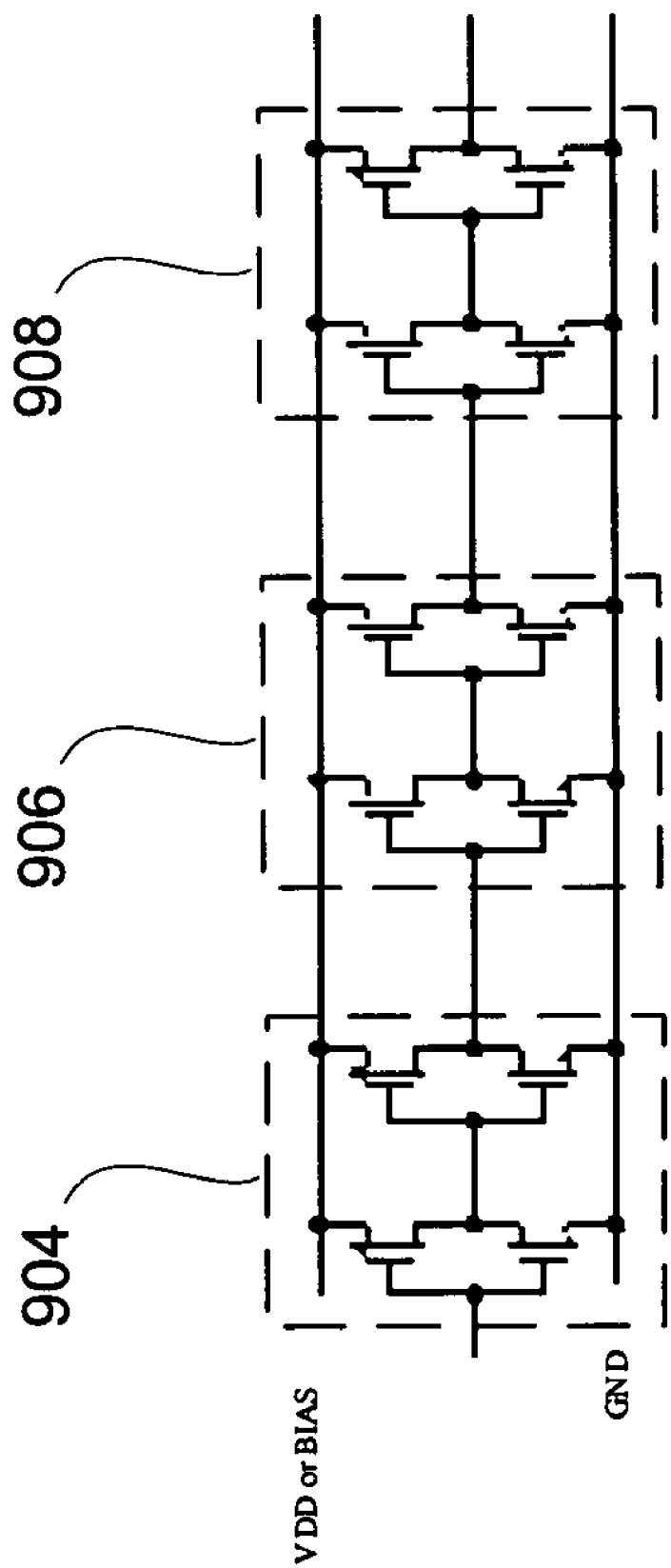
FIG. 10A shows an implementation of the delay elements shown in FIG. 9, according to an embodiment of the present invention.
Figure 10B:
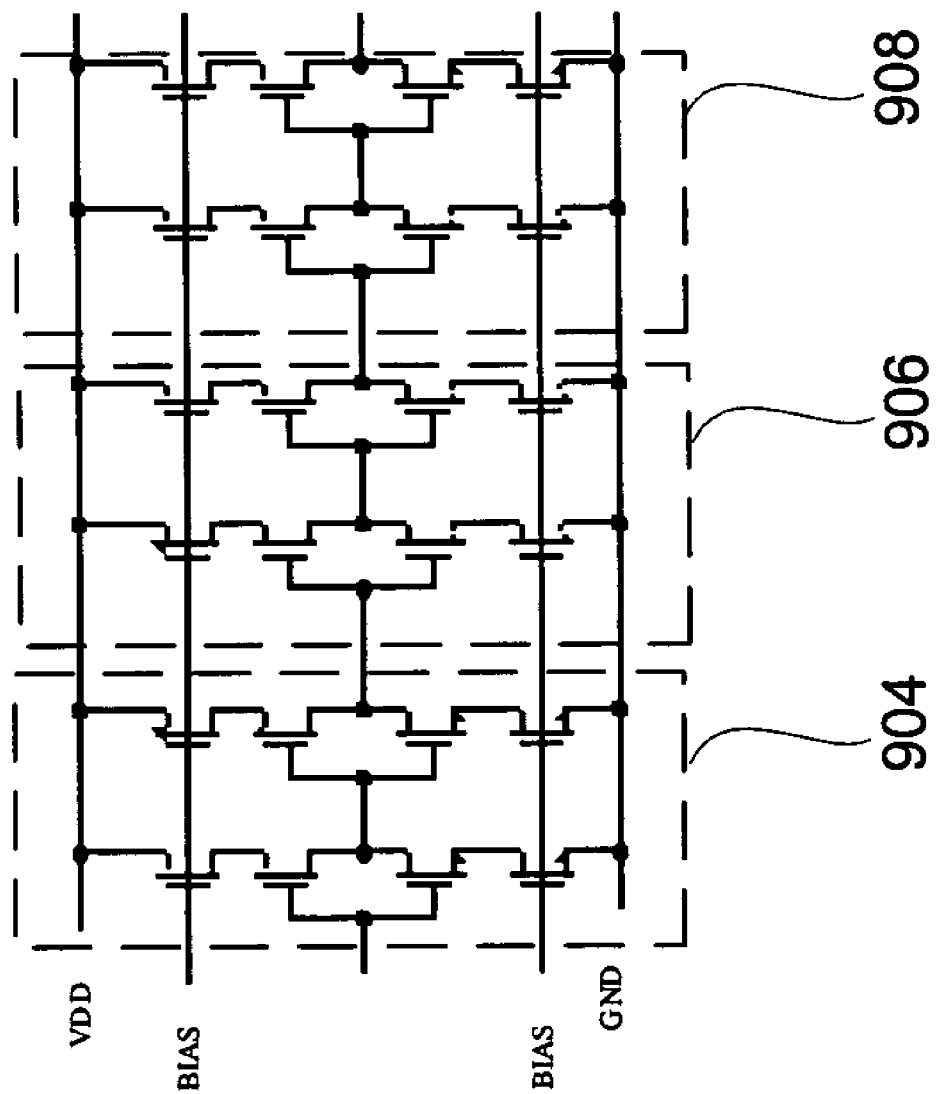
FIG. 10B shows an alternative implementation of the delay elements shown in FIG. 9, according to an embodiment of the present invention.

FIG. 10A shows a specific implementation of the delays elements 904, 906 and 908, in accordance with an embodiment of the present invention. In FIG. 10A, each delay element provides a fixed delay output. FIG. 10B shows an embodiment where the delay elements have an adjustable delay. The adjustable frequency bias and adjustable delays enable the output waveforms to be maintained over frequency and unit-unit variations.

These are just a few examples of the stepped-sine waves that could be produced in accordance with embodiments of the present invention. Preferably each stepped-sine wave is symmetrical to get rid of even harmonics, as well as shaped in a manner to reduce or eliminate 3rd and higher odd harmonics where desired.

In accordance with embodiments of the present invention, to eliminate a harmonic an up-step should be followed by a down-step of the same size, in phase with the harmonic to be cancelled. Although embodiments of the present invention are not meant to cover 2-level, 2-interval square waves (but rather cover waveform with at least 3 levels), such a square wave is useful for explaining how up-steps and in-phase down-steps can be used to eliminate harmonics. A symmetric 2-level, 2-interval square wave is at a low level for 180 degrees, and then at a high level for 180 degrees. This causes the time period of each interval to be ½ that of the fundamental (i.e., 1/y, where y is the number of intervals). So it can be seen that the square wave hits the 2nd harmonic oscillator with plus phase on the rising edge of the square, and in down phase on the falling edge of the square, hence no 2nd harmonic.

For a symmetric 3-level wave, step-up by an amount (A) at 30 degrees and step-down again by the same amount (A) at 30+120 degrees. Hence no 2nd harmonic. Actually, no even harmonics at all, because all the even harmonics are still hit in anti-phase when the down-step is 180 degrees delayed. Looking at the 3rd harmonic for the 3-level wave, the 3rd harmonic has a 120 degree cycle relative to the fundamental. If up-steps occur 120 degrees from down-steps (where up-steps and corresponding down-steps have equal magnitude), they cancel out the 3rd harmonics. Thus, the 3-level steps-up at 30 degrees and down at 150 degrees, to cancel the 3rd harmonic.

In terms of a mathematical formulation, to eliminate the:
2nd harmonic: 180 degrees apart from every up-step, there should be a down step of equal magnitude.
3rd harmonic: 120 degrees (or 240 degrees) apart from every up-step, there should be a down step of equal magnitude.
4th harmonic: 90 degrees, (or 180, or 270 degrees) apart from every up-step, there should be a down step of equal magnitude.
5th harmonic: 72 degrees (or 144, or 216 or 288 degrees) apart from every up-step, there should be a down-step of equal magnitude (i.e., 360/5=72).
nth harmonics: 360/n degrees (or 360 m/n degrees) apart from every up-step, there should be a down-step of equal magnitude.

But, since the 4th harmonic is eliminated in the case of the square wave at 180 degrees, the law is actually a little looser. That is, to eliminate the nth harmonic: All up-steps must be followed by an equal down step m*360/n degrees later, where m is any integer and n is an odd integer (e.g., 1, 3, etc.). But this will be limited by the resolution bandwidth for large m/n. In practice, m is preferably a small integer.

While the waveform generators of the present invention have been described as being useful in a laser driver environment, they can be useful in any environment where a reduction in harmonics is desired.

The foregoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A laser driver for use in driving a laser diode, comprising:
a read driver to produce a read current signal;

a waveform generator to produce a substantially symmetrical x-level, y-interval current signal that has substantially no even harmonics and reduced odd harmonics, where x is an odd integer $\geq 3$, and y is an even integer $\geq 6$; and an output stage of the laser driver that adds the signal produced by the read driver to the signal produced by the waveform generator to produce a drive signal that is used to drive the laser diode.

2. The laser driver of claim 1, wherein the waveform generator produces a substantially symmetrical 3-level, 6-interval current signal that has substantially no even harmonics and substantially no 3rd harmonic.

3. The laser driver of claim 2, wherein for each up-step of the substantially symmetrical 3-level, 6-interval current signal, there is a down-step of substantially equal magnitude to the up-step that is separated by substantially 120 degrees from the up-step.

4. The laser driver of claim 2, wherein 360 degrees of the substantially symmetrical 3-level, 6-interval current signal includes:
  a first portion that is at a low current level for a first interval;
  a second portion that is at a mid current level for a second interval, the second portion following the first portion;
  a third portion that is at a high current level for a third interval and a fourth interval, the third portion following the second portion;
  a fourth portion that is at the mid current level for a fifth interval, the fourth portion following the third portion; and
  a fifth portion that is at the low current level for a sixth interval, the fifth portion following the fourth portion;
  wherein each of the first through sixth intervals is substantially 60 degrees.

5. The laser driver of claim 4, wherein a difference between the low current level and the mid current level is substantially equal to a difference between the mid current level and the high current level.

6. The laser driver of claim 1, wherein the waveform generator produces a substantially symmetrical 5-level, 8-interval current signal that has substantially no even harmonics and reduced 3rd and 5th harmonics.

7. The laser driver of claim 6, wherein:
  for each up-step of the substantially symmetrical 5-level, 8-interval current signal, there is a down-step of substantially equal magnitude to the up-step.

8. The laser driver of claim 7, wherein 360 degrees of the substantially symmetrical 5-level, 8-interval current signal includes:
  a first portion that is at a first current level for a first interval;
  a second portion that is at a second current level for a second interval, the second portion following the first portion, and the second current level being greater than the first current level;
  a third portion that is at a third current level for a third interval, the third portion following the second portion, and the third current level being greater than the second current level;
  a fourth portion that is at a fourth current level for a fourth interval, the fourth portion following the third portion, and the fourth current level being greater than the third current level;
  a fifth portion that is at a fifth current level for a fifth interval, the fifth portion following the fourth portion, and the fifth current level being greater than the fourth current level;
  a sixth portion that is at the fourth current level for a sixth interval, the sixth portion following the fifth portion;
  a seventh portion that is at the third current level for a seventh interval, the seventh portion following the sixth portion; and
  an eighth portion that is at the second current level for an eighth interval, the eighth portion following the seventh portion;
  wherein each of the first through eighth intervals is substantially 45 degrees.

9. The laser driver of claim 8, wherein:
  a difference between the first and second current levels is substantially equal to a difference between the fourth and fifth current levels;
  a difference between the second and third current levels is substantially equal to a difference between the third and fourth current levels; and
  the difference between the second and third current levels is about three times the difference between the first and second current levels.

10. The laser driver of claim 1, wherein the waveform generator produces a substantially symmetrical x-level, y-interval current signal that has substantially no even harmonics and substantially no $n^{th}$ odd harmonic by producing a waveform that includes, for every up-step, a down-step of substantially equal magnitude that is m*360/n degrees apart from the up-step, where m is any integer and n is an odd integer.

11. The laser driver of claim 1, wherein the waveform generator comprises:
  a ring-oscillator including a plurality of differential delay elements, each of which produces differential delay signals;
  logic circuitry that receives at least some of the delay signals produced by the ring-oscillator and produces internal drive signals therefrom; and
  adding circuitry to add the internal drive signals and thereby produce the substantially symmetrical x-level, y-interval current signal therefrom.

12. The laser driver of claim 1, wherein the waveform generator comprises:
  an oscillator that produces a square wave signal;
  a delay element that receives the square wave signal and produces a delayed square wave signal therefrom;
  logic circuitry that receives the square wave signal and the delayed square wave signal and produces internal drive signals therefrom; and
  adding circuitry to add the internal drive signals and thereby produce the symmetrical x-level, y-interval current signal therefrom.

13. The laser driver of claim 1, wherein the waveform generator comprises:
  an oscillator that produces a square wave signal;
  a plurality of delay elements that produces a plurality of delayed square wave signals;
  logic circuitry that receives the square wave signal and the delayed square wave signals and produces internal drive signals therefrom; and
  adding circuitry to add the internal drive signals and thereby produce the symmetrical x-level, y-interval current signal therefrom.

14. The laser driver of claim 1, wherein the output stage is configured to produce a drive signal useful for driving a push-pull type load.

15. The laser driver of claim 1, wherein the output stage is configured to produce a drive signal useful for driving a push-only type load.

16. A method for producing a drive signal for use in driving a laser diode, comprising:
(a) producing a read current signal;
(b) producing a substantially symmetrical x-level, y-interval current signal that has substantially no even harmonics and reduced odd harmonics, where x is an odd integer $\geq 3$, and y is an even integer $\geq 6$; and
(c) adding the read current signal to the substantially symmetrical x-level, y-interval current signal to produce a drive signal for use in driving a laser diode.

17. The method of claim 16, wherein step (b) comprises producing a substantially symmetrical 3-level, 6-interval current signal that has substantially no even harmonics and substantially no 3rd harmonic.

18. The method of claim 17, wherein step (b) includes producing, for each up-step of the substantially symmetrical current signal, a down-step of substantially equal magnitude to the up-step that is separated by substantially 120 degrees from the up-step.

19. The method of claim 17, wherein step (b) includes producing the substantially symmetrical 3-level, 6-interval current signal such that 360 degrees of the substantially symmetrical current signal includes:
a first portion that is at a low current level for a first interval;
a second portion that is at a mid current level for a second interval, the second portion following the first portion;
a third portion that is at a high current level for a third interval and a fourth interval, the third portion following the second portion;
a fourth portion that is at the mid current level for a fifth interval, the fourth portion following the third portion; and
a fifth portion that is at the low current level for a sixth interval, the fifth portion following the fourth portion;
wherein each of the first through sixth intervals is substantially 60 degrees.

20. The method of claim 19, wherein step (b) includes producing the substantially symmetrical 3-level, 6-interval current signal, such that a difference between the low current level and the mid current level is substantially equal to a difference between the mid current level and the high current level.

21. The method of claim 16, wherein step (b) comprises producing a substantially symmetrical 5-level, 8-interval current signal that has substantially no even harmonics and reduced 3rd and 5th harmonics.

22. The method of claim 20, wherein step (b) includes producing, for each up-step of the substantially symmetrical current signal, a down-step of substantially equal magnitude to the up-step.

23. The method of claim 22, wherein step (b) includes producing the substantially symmetrical 5-level, 8-interval current signal such that 360 degrees of the substantially symmetrical includes:
a first portion that is at a first current level for a first interval;
a second portion that is at a second current level for a second interval, the second portion following the first portion, and the second current level being greater than the first current level;
a third portion that is at a third current level for a third interval, the third portion following the second portion, and the third current level being greater than the second current level;
a fourth portion that is at a fourth current level for a fourth interval, the fourth portion following the third portion, and the fourth current level being greater than the third current level;
a fifth portion that is at a fifth current level for a fifth interval, the fifth portion following the fourth portion, and the fifth current level being greater than the fourth current level;
a sixth portion that is at the fourth current level for a sixth interval, the sixth portion following the fifth portion;
a seventh portion that is at the third current level for a seventh interval, the seventh portion following the sixth portion; and
an eighth portion that is at the second current level for an eighth interval, the eighth portion following the seventh portion;
wherein each of the first through eighth intervals is substantially 45 degrees.

24. The method of claim 23, wherein step (b) includes producing the substantially symmetrical 5-level, 8-interval current signal such that:
a difference between the first and second current levels is substantially equal to a difference between the fourth and fifth current levels;
a difference between the second and third current levels is substantially equal to a difference between the third and fourth current levels; and
the difference between the second and third current levels is about three times the difference between the first and second current levels.

25. The method of claim 16, wherein step (b) comprises producing a substantially symmetrical x-level, y-interval current signal that has substantially no even harmonics and substantially no $n^{th}$ odd harmonic by producing a waveform that includes, for every up-step, a down-step of substantially equal magnitude that is m*360/n degrees apart from the up-step, where m is any integer and n is an odd integer.

26. The method of claim 16, wherein step (b) includes:
using a ring-oscillator to produce a plurality of differential delay signals;
using logic circuitry to produce internal drive signals from at least some of the delay signals; and
adding the internal drive signals to thereby produce the substantially symmetrical x-level, y-interval current signal.

27. The method of claim 16, wherein step (b) includes:
using an oscillator to produce a square wave signal;
using a delay element to produce a delayed square wave signal from the square wave signal;
using logic circuitry to produce internal drive signals from the square wave signal and the delayed square wave signal; and
adding the internal drive signals to thereby produce the symmetrical x-level, y-interval current signal.

28. The method of claim 16, wherein step (b) includes:
using an oscillator to produces a square wave signal;
using a plurality of delay elements to produce a plurality of delayed square wave signals;
using logic circuitry to receive the square wave signal and the delayed square wave signals and produce internal drive signals therefrom; and using adding circuitry to add the internal drive signals and thereby produce the symmetrical x-level, y-interval current signal therefrom.

29. The method of claim 16, wherein step (c) comprises producing the drive signal so it useful for driving a push-pull type load.

30. The method of claim 16, wherein step (c) comprises producing the drive signal so it is useful for driving a push-only type load.

31. The laser driver of claim 1, wherein the drive signal, which the output stage produces by adding the signal produced by the read driver to the signal produced by the waveform generator, is used to drive the laser diode without filtering the drive signal and without filtering the signal produced by the waveform generator.

* * * * *